(12) United States Patent
Reinmuth et al.

(10) Patent No.: US 12,230,457 B2
(45) Date of Patent: Feb. 18, 2025

(54) METHOD FOR MANUFACTURING A MEMS SWITCH HAVING AN EMBEDDED METAL CONTACT

(71) Applicant: Robert Bosch GmbH, Stuttgart (DE)

(72) Inventors: Jochen Reinmuth, Reutlingen (DE); Matthew Lewis, Reutlingen (DE); Peter Schmollngruber, Aidlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/715,213

(22) Filed: Apr. 7, 2022

(65) Prior Publication Data
US 2022/0328258 A1   Oct. 13, 2022

(30) Foreign Application Priority Data

Apr. 12, 2021   (DE) .................. 10 2021 203 566.3

(51) Int. Cl.
| | | |
|---|---|---|
| *H01H 1/00* | (2006.01) | |
| *H01H 1/06* | (2006.01) | |
| *H01H 11/00* | (2006.01) | |
| *H01H 11/06* | (2006.01) | |
| *H01H 59/00* | (2006.01) | |

(Continued)

(52) U.S. Cl.
CPC ............ *H01H 1/0036* (2013.01); *H01H 1/06* (2013.01); *H01H 11/00* (2013.01); *H01H 11/06* (2013.01); *H01H 59/0009* (2013.01); *H01H 2001/0057* (2013.01); *H01H 2001/0078* (2013.01); *H01L 21/32051* (2013.01); *H01L 21/76224* (2013.01)

(58) Field of Classification Search
CPC ... H01H 2001/0057; H01H 2001/0078; H01H 1/0036; H01H 1/06; H01H 1/20; H01H 11/06; H01H 59/0009; H01H 2001/0052; H01H 1/14; H01H 2001/0042; H01H 2001/0047; H01H 2011/065
See application file for complete search history.

(56) References Cited

U.S. PATENT DOCUMENTS

| | | | |
|---|---|---|---|
| 6,078,016 A | 6/2000 | Yoshikawa et al. | |
| 2003/0018420 A1 * | 1/2003 | Apanius ................ | H01H 35/14 701/45 |

(Continued)

FOREIGN PATENT DOCUMENTS

| | | | | |
|---|---|---|---|---|
| EP | 2365498 A1 | 9/2011 | | |
| EP | 2365499 A1 * | 9/2011 | ......... | B81C 1/00166 |

(Continued)

OTHER PUBLICATIONS

Machine Translation of JP-2016114510 (Year: 2016).*

*Primary Examiner* — Younes Boulghassoul
(74) *Attorney, Agent, or Firm* — NORTON ROSE FULBRIGHT US LLP; Gerard A. Messina

(57) ABSTRACT

A MEMS switch that includes a substrate with a first insulating layer and a silicon layer thereabove, a fixed portion and a movable switching portion being formed in the silicon layer.
A first metal layer is situated in recesses in the silicon layer at a side of the silicon layer facing away from the substrate, the first metal layer forming at least one switchable electrical contact between the fixed portion and the switching portion. A method for manufacturing a MEMS switch including at least one embedded metal contact is also described.

12 Claims, 16 Drawing Sheets

(51) Int. Cl.
  *H01L 21/3205*  (2006.01)
  *H01L 21/762*  (2006.01)

(56) References Cited

U.S. PATENT DOCUMENTS

| | | | |
|---|---|---|---|
| 2003/0210124 A1 | 11/2003 | Volant et al. | |
| 2004/0216988 A1* | 11/2004 | Receveur | B81B 3/0054 |
| | | | 200/181 |
| 2004/0220650 A1* | 11/2004 | Houben | H01H 59/0009 |
| | | | 607/116 |
| 2006/0087390 A1* | 4/2006 | Yuba | H01H 59/0009 |
| | | | 335/78 |
| 2009/0239366 A1 | 9/2009 | Nejad et al. | |
| 2009/0260960 A1* | 10/2009 | Gritters | H01H 59/0009 |
| | | | 310/309 |
| 2009/0261517 A1* | 10/2009 | Yao | F16F 3/02 |
| | | | 267/160 |
| 2011/0209970 A1* | 9/2011 | Masuda | H01H 1/06 |
| | | | 29/622 |
| 2011/0220472 A1* | 9/2011 | Masuda | H01H 45/14 |
| | | | 200/181 |
| 2011/0220473 A1* | 9/2011 | Yoshitake | H01H 1/06 |
| | | | 200/508 |
| 2012/0305370 A1* | 12/2012 | Shimoda | G01P 15/135 |
| | | | 200/61.45 R |
| 2013/0048480 A1 | 2/2013 | Yamamoto et al. | |
| 2014/0202838 A1* | 7/2014 | Sano | H01H 59/0009 |
| | | | 200/181 |
| 2019/0157015 A1* | 5/2019 | Nguyen | H03H 9/462 |
| 2022/0293383 A1* | 9/2022 | Reinmuth | H01H 59/0009 |

FOREIGN PATENT DOCUMENTS

| | | | | |
|---|---|---|---|---|
| JP | 2016114510 A | * | 6/2016 | |
| WO | WO-2016086998 A1 | * | 6/2016 | H01H 1/0036 |

* cited by examiner

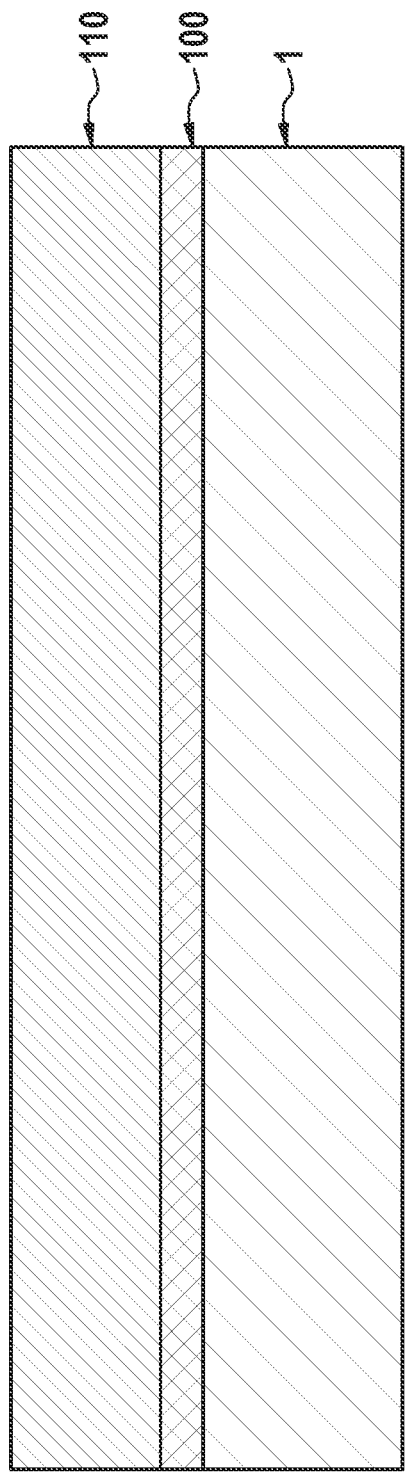

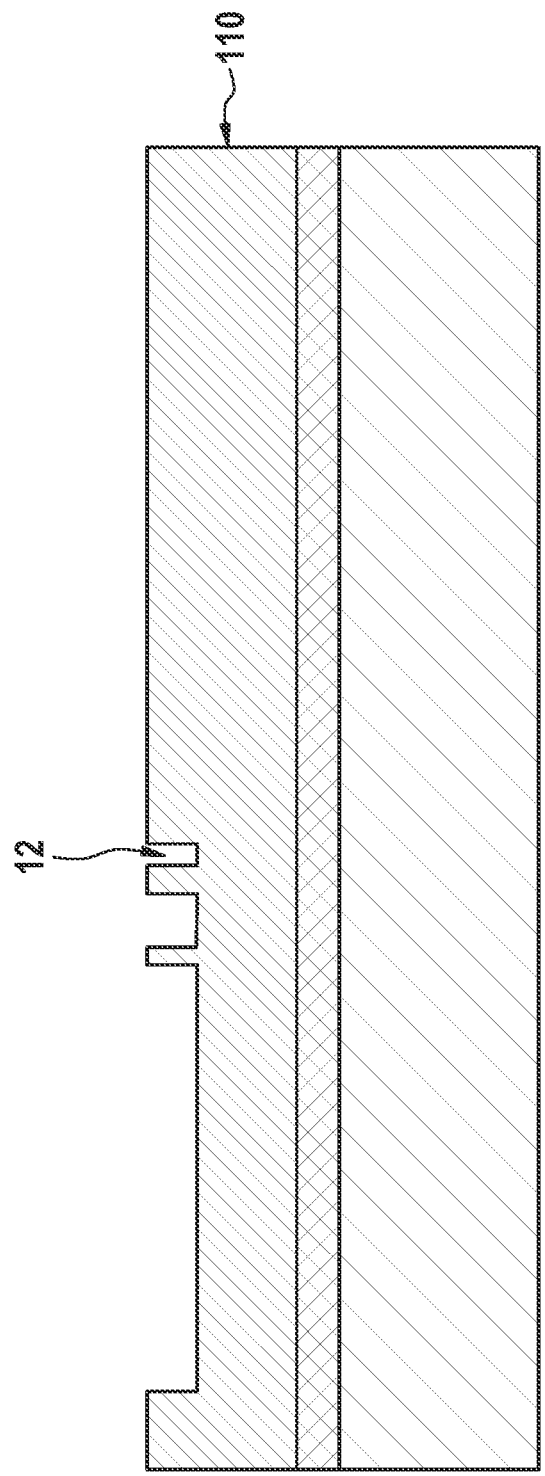

METHOD FOR MANUFACTURING A MEMS SWITCH HAVING AN EMBEDDED METAL CONTACT

FIELD

The present invention is directed to a MEMS switch that includes a substrate with a first insulating layer and a silicon layer thereabove, a fixed portion and a movable switching portion being formed in the silicon layer.

BACKGROUND INFORMATION

There are many different types of relays. Typical miniature relays have a size of approximately 1 cm, are driven via a solenoid, have a certain non-negligible current consumption in the switched-on state, and are optimized for various applications.

To guarantee a long service life and also to enable switching of currents during the switching operation, there are special relays whose contacts are made of tungsten. If a relay is switched on or off under current, electrical flashovers result which impair the contact surfaces. Tungsten is a material that is very robust against flashovers, and therefore guarantees a long service life for this application. A disadvantage of tungsten is that it is a very expensive material that is mechanically difficult to process, for which reason tungsten contacts are used in particular only for this application in relays.

In addition to the conventional magnetically operated relays, capacitively actuatable MEMS switches have also recently come into use. They have very low current consumption due to their drive principle. For example, the ADGM1304 MEMS switch from Analog Devices is available, which is manufactured in surface micromechanics (FIG. 1). The switching element has a design that is movable out of the substrate plane (out-of-plane).

A capacitively actuatable MEMS switch including a switching element that is movable in parallel to the substrate plane (in-plane) is described in German Patent Application No. DE 102021202238.3 (FIG. 2).

MEMS relays have many advantages over conventional relays, such as quick switching times, low current consumption, small installation space, and many more. However, only MEMS relays that switch in the de-energized state are available thus far.

In micromechanical manufacturing processes, metal layers are normally deposited as a layer and structured via an etching process, using a resist mask, as local etching protection. A restriction of this method is that thick metal layers always require a metal deposition in at least the target thickness of the metal plug. This is particularly critical for tungsten layers, since they may cause stress with regard to the substrate during the deposition, resulting in bending of the substrate. To minimize the bending so that the substrate may be further processed, for example to allow a resist mask to be applied and structured, only tungsten layers having thicknesses less than 500 nm may be applied for typical substrate thicknesses of 700 µm.

A further restriction is that, in particular for tungsten and many other metals, on the one hand there are no etching processes that provide very vertical etching flanks in order to achieve large contact areas upon a lateral deflection of the switching portion of the relay. On the other hand, there are also no etching processes for tungsten and many other metals that are able to create very narrow, deep trenches in order to achieve small distances upon a lateral movement of the contact areas.

In addition to the typical restriction of the known metal etching processes with regard to the shape and the depth of the etching trenches, these etching processes also have poor selectivity toward the resist mask. This means that one must either use a thick resist mask with poor resolution, i.e., which allows only wide trenches, or a thin resist mask with high resolution is used, but with which only trenches of low depth may be created in tungsten (W).

A further restriction is that according to the conventional structuring of very thick metal layers, a high topography is present on the substrate, and it is technically very difficult or impossible to deposit and structure further layers.

Insulating layers such as layer 20 or strip conductors such as layer 21 in practice would no longer be producible on thick metal layers. In contrast, it is also known that very vertical trenches may be etched into silicon via cyclic trenching processes.

It is further conventional that the trenching processes in silicon have a high resist selectivity.

SUMMARY

An object of the present invention is to provide a capacitively activated MEMS relay which may reliably switch on and off, also in the current-carrying state.

The present invention is directed to a MEMS switch that includes a substrate with a first insulating layer and a silicon layer thereabove, a fixed portion and a movable switching portion being formed in the silicon layer.

In accordance with an example embodiment of the present invention, a first metal layer is situated in recesses in the silicon layer at a side of the silicon layer facing away from the substrate, the first metal layer forming at least one switchable electrical contact between the fixed portion and the switching portion. An embedded or buried contact in the silicon layer is thus provided (a metal plug).

In one advantageous example embodiment of the present invention, the first metal layer is made of tungsten. The approach according to the present invention, to use a buried or embedded first metal layer as the contact surface of a MEMS relay, for the first time allows a MEMS relay to be constructed using tungsten contacts, using steps known in semiconductor technology. This is intended to allow a fundamental improvement in the behavior of MEMS relays.

One main feature of the present invention includes mapping a negative image of the subsequent metal plug in silicon via a trenching process. Very narrow distances between the metal plugs may be achieved due to the use of a negative image. The narrow distances are initially filled with silicon, but after the metal deposition may be opened via a further trenching process, it being possible for the metal filling itself to act as a mask; this is therefore a self-adjusting process that allows very small gap widths.

In addition, narrow trenches are created in silicon. If the trenches are narrower than one-half the layer thickness of the metal deposition, the trenches may be completely filled. It is thus possible to fill trenches to a theoretically arbitrary depth, regardless of what metal layer thickness is deposited. Since only small layer thicknesses need to be deposited, slow but very conformant CVD processes, i.e., depositions from the gas phase, may be utilized. It is often difficult to carry out CVD depositions in narrow trenches. For this purpose, diffusion barriers and seed layers are usually necessary for the CVD deposition. In the present approach, diffusion barriers and seed layers may advantageously be dispensed with by utilizing silicon as a carrier layer. It is provided to utilize an exchange reaction of Si with WF6 in a first step to create a first seed layer in silicon. The deposition may take place with a certain portion of H2 to achieve quicker deposition in silicon. In a further deposition step, tungsten is then deposited purely from the gas phase, with a reaction between WF6 and an intentionally higher portion of H2 as reduction agent in order to not create cavities in the Si via the reduction reaction of WF6 with Si. After the deposition, polishing of the protruding metal at the surface takes place; this produces a very smooth surface on which further layers may be applied without problems, in contrast to the related art.

In another advantageous example embodiment of the present invention, the first metal layer is made of nickel.

Moreover, the present invention relates to a method for manufacturing a MEMS switch that includes at least one embedded metal contact.

For this purpose, a manufacturing method and an arrangement for an in-plane MEMS relay including embedded metal contacts are provided.

In particular, in accordance with an example embodiment of the present invention, it is provided to introduce trenches, which are filled with tungsten, into a silicon layer. A portion of the tungsten surface is subsequently exposed via a silicon trenching process. In particular, the silicon trenching process is applied in such a way that the tungsten surfaces in the plane protrude slightly beyond the silicon surfaces with an overhang, and adjacent tungsten surfaces thus preferably come into contact with one another during in-plane movement. At least one deflectable switching element is defined via the trenching process. When a first metal layer made of tungsten or nickel, for example, is deposited in narrow trenches and the edge of the trench (and thus the edge of the first metal) is subsequently exposed, a large metallic contact surface and a large conductor cross-sectional area are advantageously achieved without the need to deposit a large metal thickness. Costs may thus be advantageously lowered, and tensions in the silicon layer via the first metal layer may be minimized.

Further advantageous embodiments of the present invention are disclosed herein.

BRIEF DESCRIPTION OF THE DRAWINGS

FIGS. 4A through 4I show a method according to the present invention for manufacturing a MEMS switch including embedded metal contacts, at various manufacturing stages.

DETAILED DESCRIPTION OF EXAMPLE EMBODIMENTS

Figure 1:
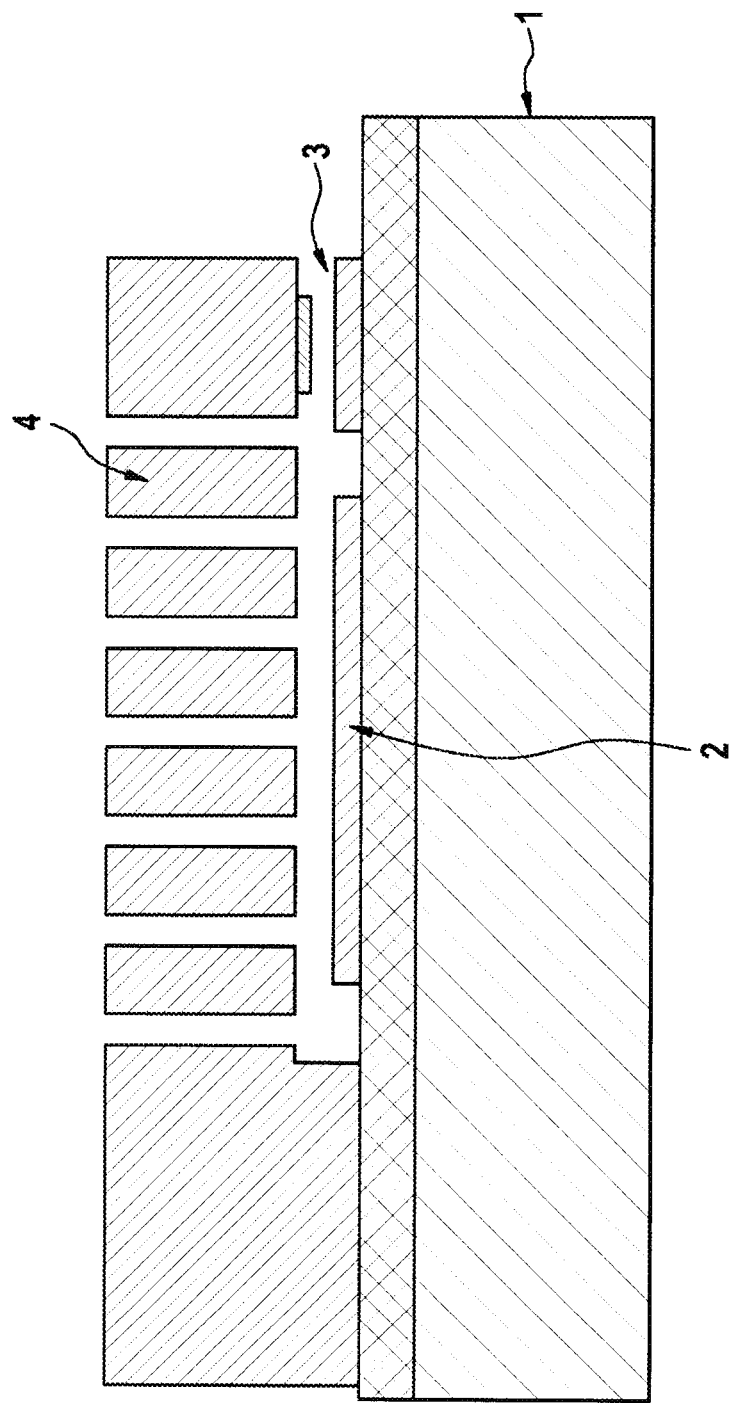
FIG. 1 schematically shows a capacitively actuatable MEMS switch including an out-of-plane switching element in the related art.

FIG. 1 schematically shows a capacitively actuatable MEMS switch including an out-of-plane switching element in the related art, in a sectional illustration. A first electrode 2 and a first contact surface 3 are provided on a substrate 1. A lever structure 4 is situated above both structures, separated by a distance. If a voltage is applied between the lever and the first electrode, a movement out of the substrate plane (out-of-plane) results. The lever is deflected essentially perpendicularly toward the substrate, and a contact between the lever and the contact surface is established.

Figure 2:
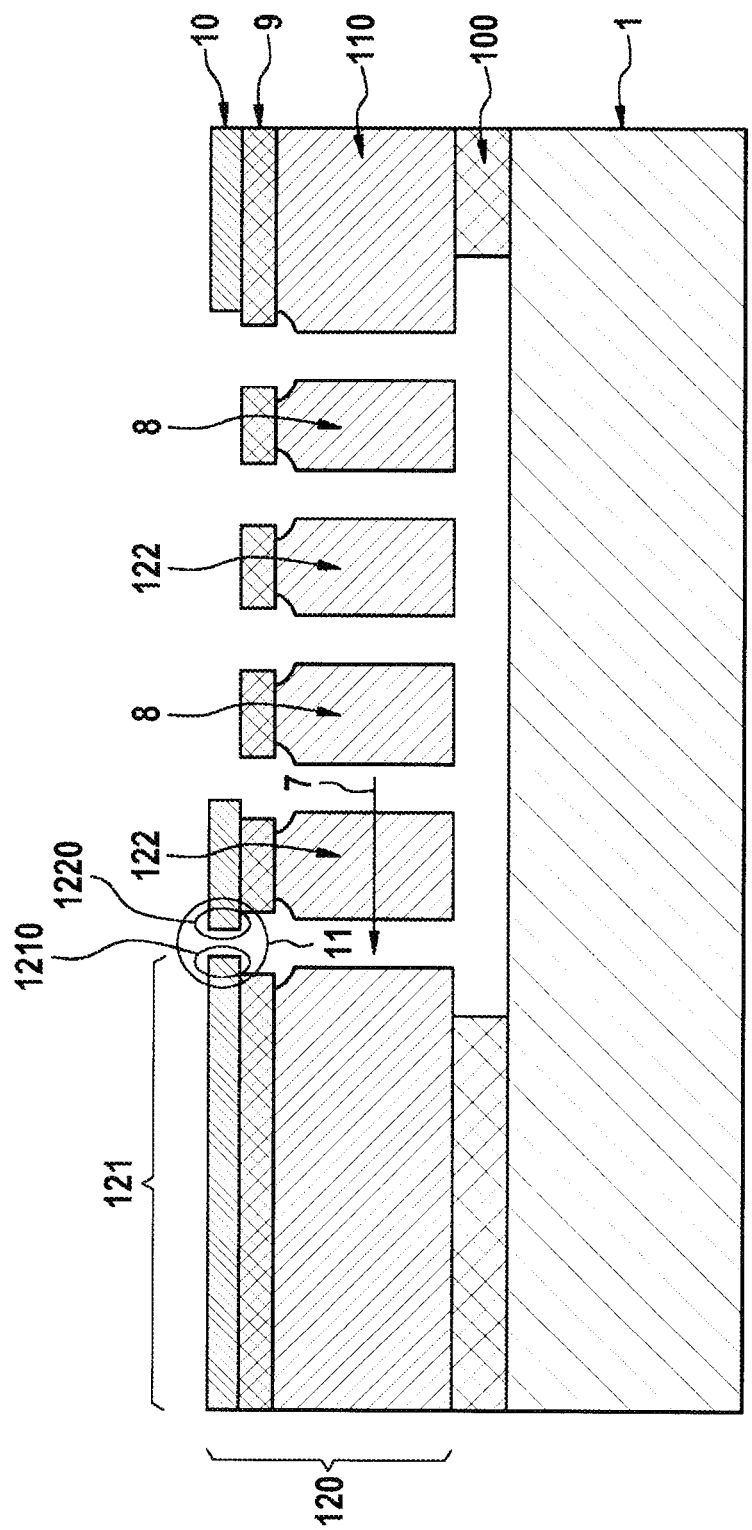
FIG. 2 schematically shows a capacitively actuatable MEMS switch including an in-plane switching element.

FIG. 2 schematically shows a capacitively actuatable MEMS switch including an in-plane switching element, in a sectional illustration. A first insulating layer 100, a silicon layer 110, a second insulating layer 9, and a metal layer 10 are situated one on top of the other on a substrate 1. The silicon layer, the second insulating layer, and the metal layer together form a micromechanical functional layer 120 in which a fixed portion 121, an electrically actuatable, deflectable switching element 122, and fixed electrodes 8 are formed.

A first contact area 1210 is formed in metal layer 10 of fixed portion 121, and a second contact area 1220 is formed in metal layer 10 of switching element 122. The switching element is deflectable in at least one first direction 7 in parallel to a main plane of extension (x, y) of the substrate. The first and the second contact area may thus come into mechanical contact with one another and thus close an electrical contact 11. The deflection of switching element 122 is effectuated by applying a voltage to oppositely situated electrode fingers 8 that are anchored to the substrate. First contact area 1210 and second contact area 1220 are each connected to their own strip conductor. An electrical connection between the strip conductors may thus be switched on and off by deflection of switching element 122.

Figure 3:
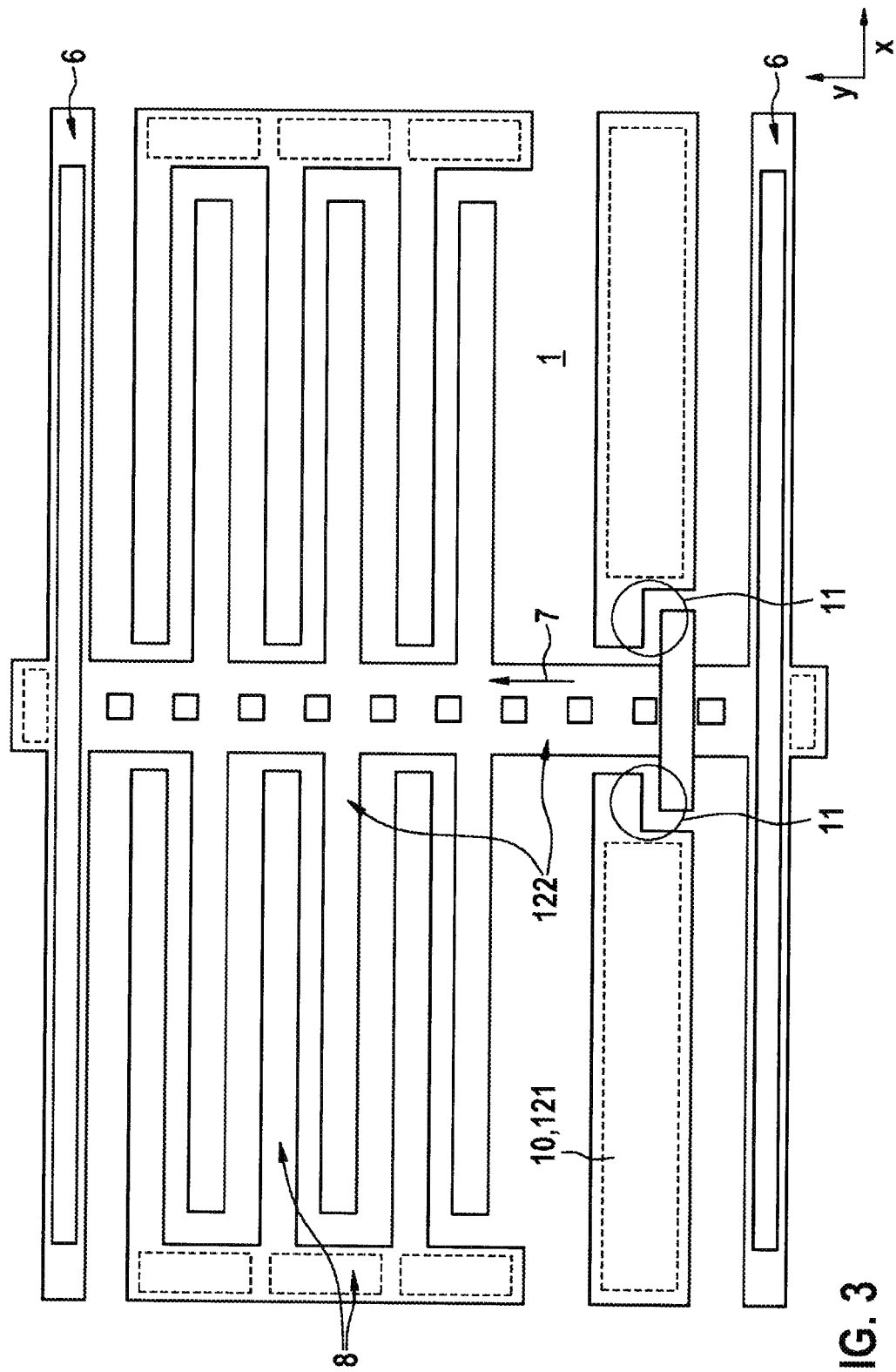
FIG. 3 schematically shows the capacitively actuatable MEMS switch including the in-plane switching element in a top view.

FIG. 3 schematically shows the capacitively actuatable MEMS switch including an in-plane switching element, in a top view. Suspension springs 6 that are anchored to underlying substrate 1 carry movable switching element 122. In addition, fixed electrodes 8 and fixed portion 121 are shown. The fixed electrodes are situated opposite from corresponding formations of switching element 122, and together with same form the capacitor plates of a capacitive drive. The capacitive drive may effectuate a movement of the switching element in first direction 7. Fixed portion 121 and an oppositely situated area of switching element 122 are covered with metal layer 10 and form switchable electrical contact 11 there.

FIGS. 4A through 4I show a method according to the present invention for manufacturing a MEMS switch including embedded metal contacts, at various manufacturing stages. The device is illustrated in each case in a sectional view and in a 3D view.

A first sacrificial layer 100, preferably an oxide layer, is deposited on a substrate 1. A silicon layer 110 is applied to the oxide layer (FIG. 4A). A polysilicon layer is preferably deposited, or a silicon substrate is bonded on and backthinned to the target thickness. A silicon layer having a thickness between 5 µm and 50 µm is preferably used.

Narrow trenches 12 are introduced into silicon layer 110 with the aid of anisotropic etching (FIG. 4B). Trenches are preferably predominantly etched that are at least as deep as they are wide. Trenches having a depth of 0.5 µm to 5 µm are preferably etched.

Figure 4C:
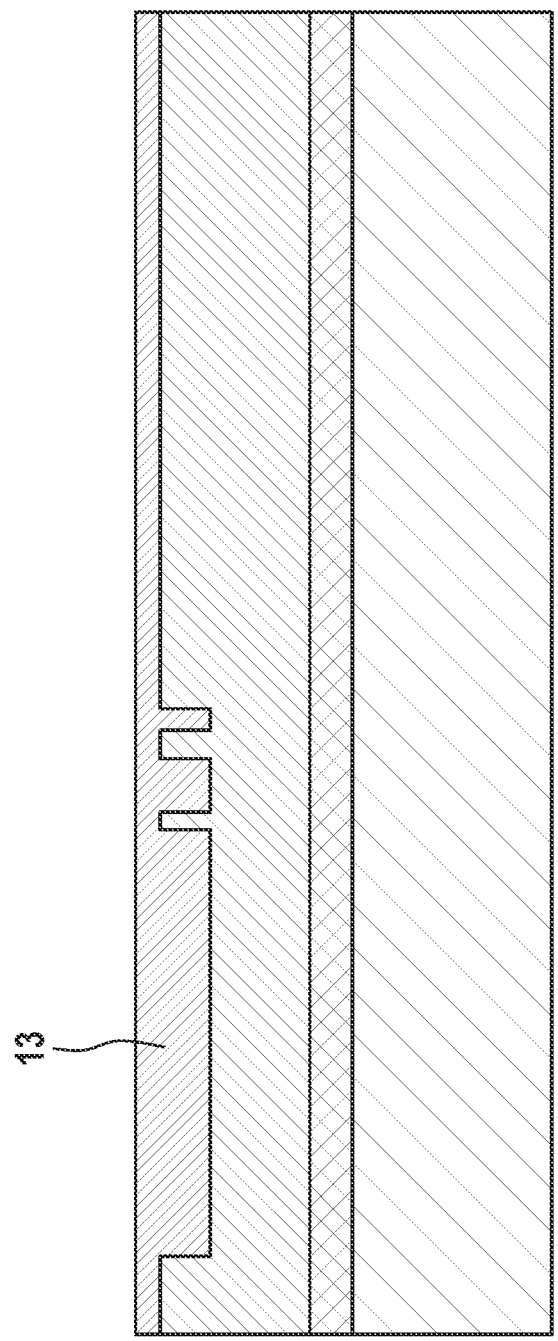

A first metal layer 13 is deposited (FIG. 4C). In particular, a tungsten layer is deposited. Enough tungsten is preferably deposited so that the narrow trenches are completely closed.

Alternatively, a nickel layer or a nickel-containing layer may be deposited. Nickel is somewhat poorer with regard to the electrical flashover resistance, but has a lower contact resistance.

Prior to depositing the first metal layer, a thin adhesive layer or a nucleation layer which does not fill the trenches may also optionally be deposited. A seed layer that is created in part by a reduction of the silicon surface is particularly advantageous.

Figure 4D:
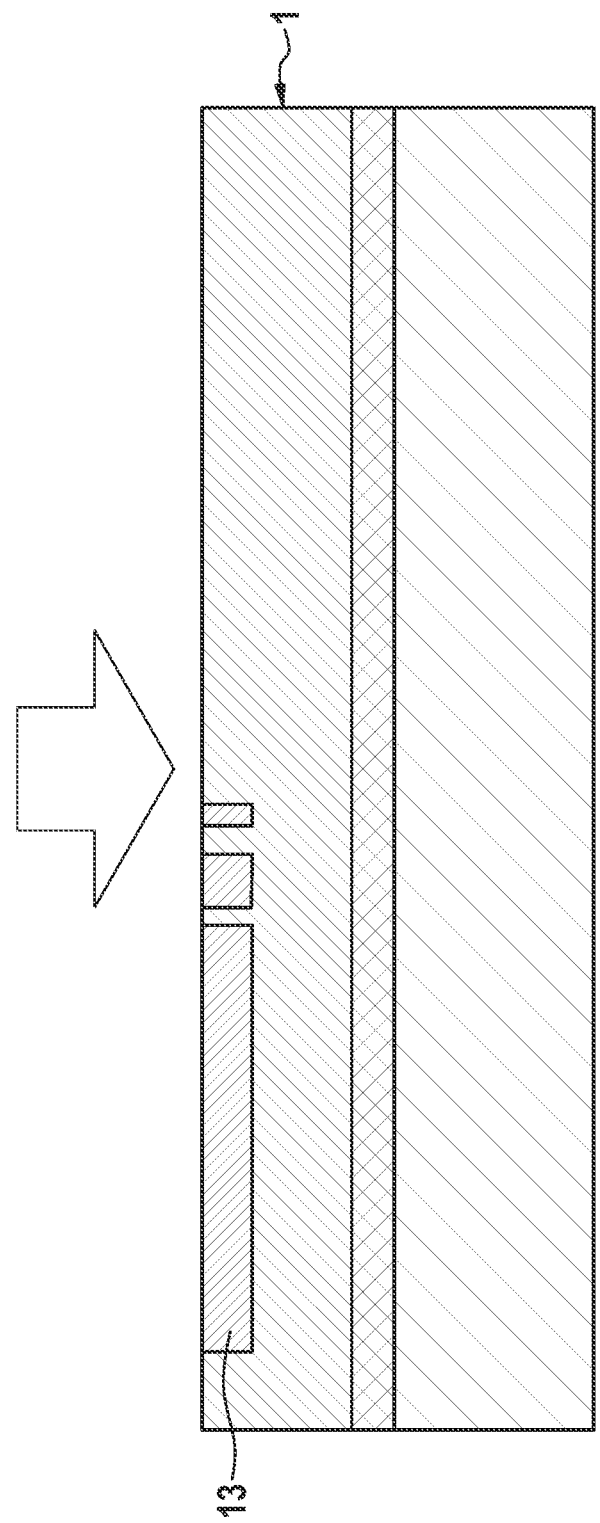

First metal layer 13 is polished down at least to the height of silicon layer 110 (FIG. 4D).

Figure 4E:
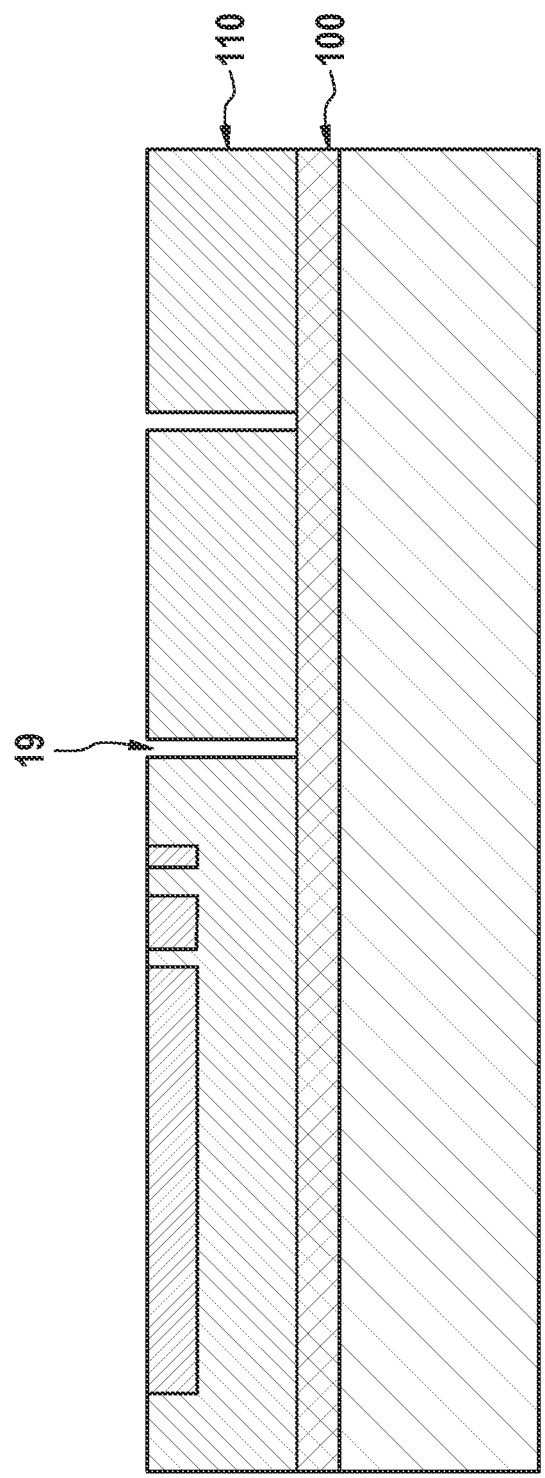

Narrow, insulating, continuous trenches 19 up to oxide layer 100 are optionally etched into silicon layer 110 (FIG. 4E).

Figure 4F:
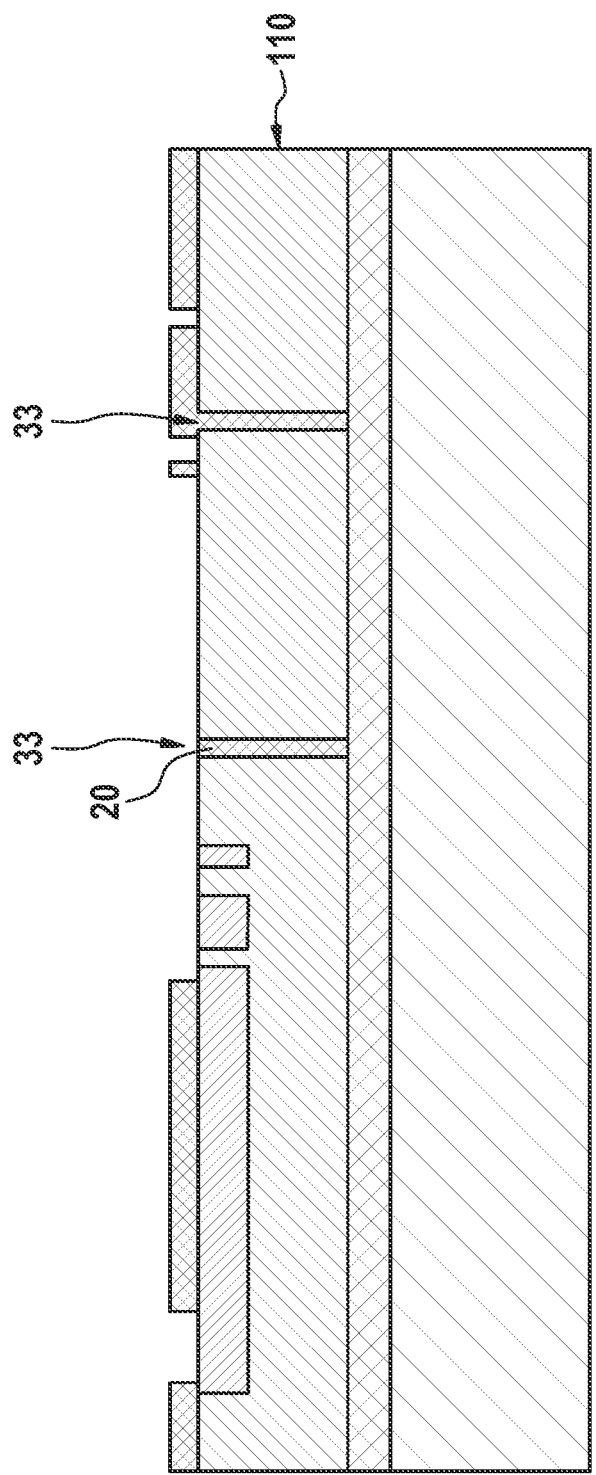

Continuous trenches 19 are subsequently filled with a dielectric material 20, resulting in filled insulation trenches 33, and a layer made of the dielectric material is also formed at the surface of silicon layer 110 (FIG. 4F). The trenches are preferably filled with a SiRiN (silicon-rich nitride) layer. The dielectric layer is also structured at the surface of silicon layer 110.

Figure 4G:
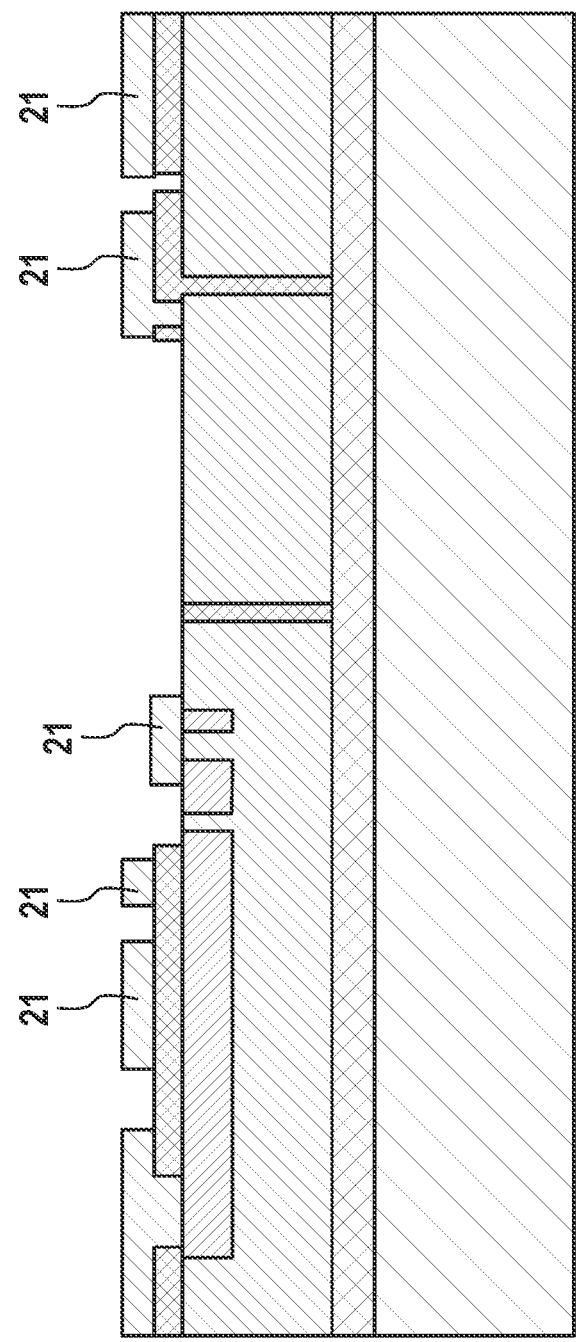

A second metal layer 21 is optionally applied and structured (FIG. 4G). An aluminum layer is preferably applied.

Further layer sequences of dielectric and metallic layers are optionally applied and structured.

Figure 4H:
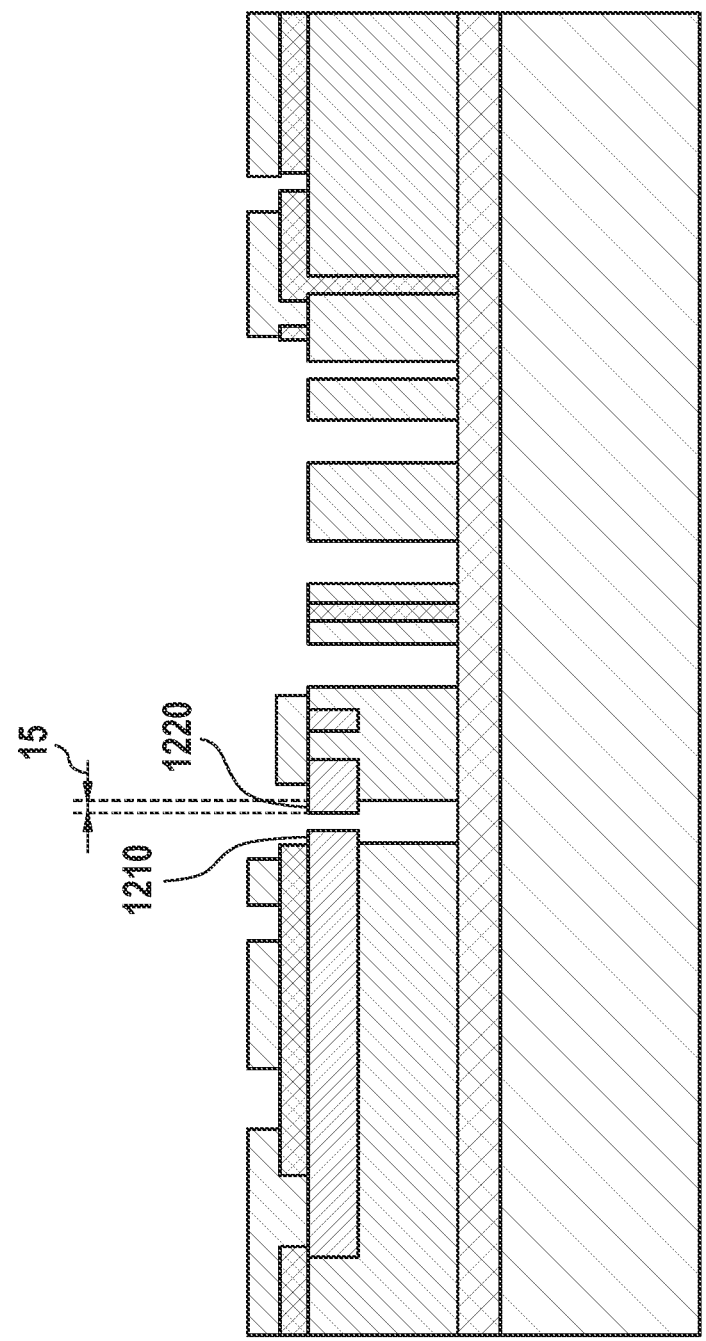
Figure 41:
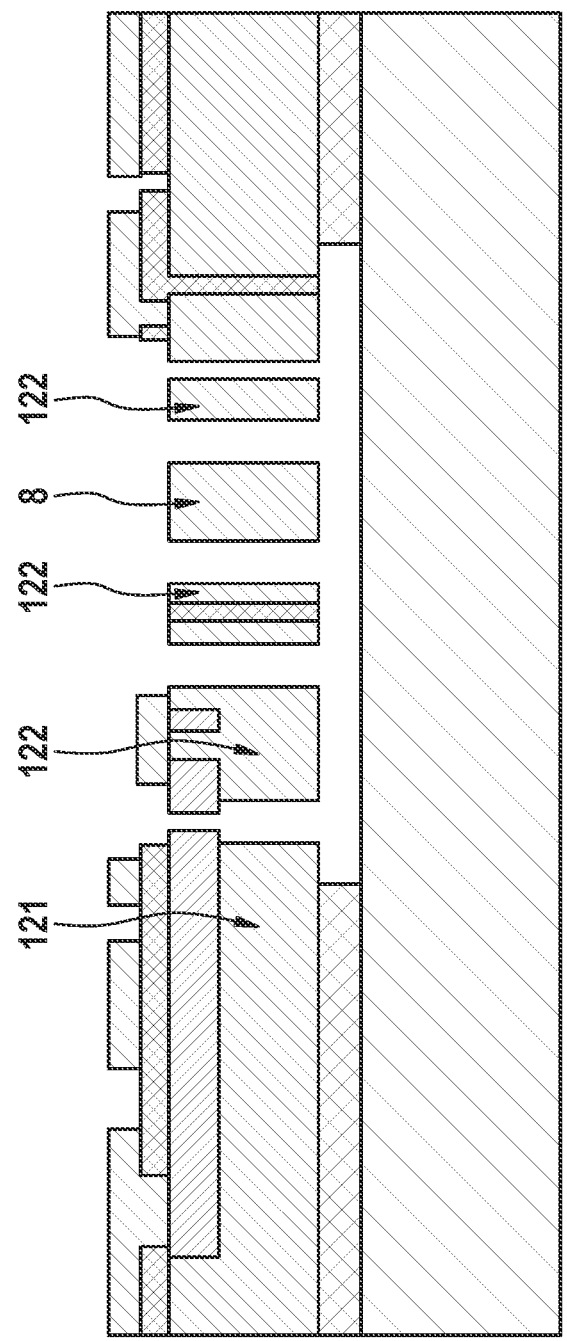

Silicon layer 110 is structured via a trenching process (FIG. 4H). The trenching process is carried out in such a way that a first contact area 1210 and a second contact area 1220 of first metal layer 13 are exposed. In particular, a trenching process is selected that produces a retraction of the silicon edge of at least 50 nm beneath the structuring mask. A horizontal protrusion of the metal edge relative to the silicon edge is thus produced around and underneath the exposed contact areas. An overhang 15 of the particular contact area beyond adjoining silicon layer 110 is preferably at least 25 nm.

Oxide layer 100 beneath a partial area of silicon layer 110 is removed in a sacrificial etching step (FIG. 4I). A gas phase etching process using HF is preferably used.

Further Embodiments of the Manufacturing Method

A cavity SOI wafer may also be utilized in an alternative manufacturing process. By using a fairly costly cavity SOI wafer, the exposure of the movable structure may already take place with the structuring of the silicon layer via a trenching process, and the etching of the first insulating layer may be dispensed with.

A polishing stop layer may optionally be applied to the silicon layer prior to the trenching step. An oxide layer or a nitride layer or an oxide nitride layer or a SiRiN layer may preferably be utilized. The structuring of the polishing stop layer may preferably take place together with the trenching step, using the same resist mask. The polishing of the tungsten layer then takes place up to the polishing stop layer. This layer may be completely or partially removed in one of the subsequent steps.

Second metal layer 21 may be used as a first component of a eutectic bonding material in order to arrange a cap 22 above the movable structures to protect these structures. The metal layer may thus be advantageously utilized not only as a strip conductor, but also as a bonding material.

Figure 5:
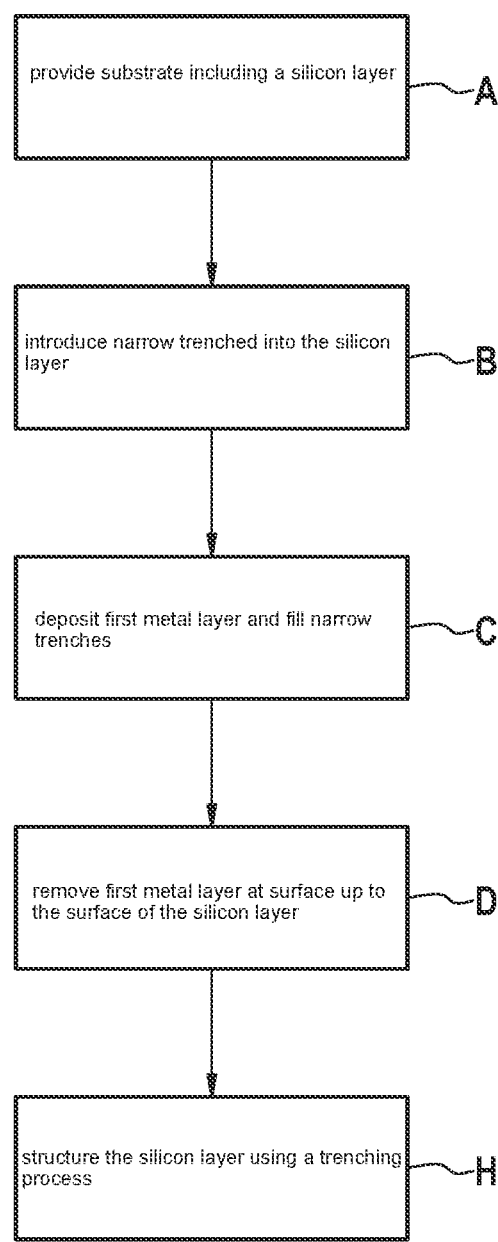
FIG. 5 schematically shows the method according to an example embodiment of the present invention for manufacturing a MEMS switch including at least one embedded metal contact.

FIG. 5 schematically shows the method according to the present invention for manufacturing a MEMS switch including embedded metal contacts.

A substrate including a silicon layer thereabove is provided in a step A.

Narrow trenches are introduced into the silicon layer in a step B.

A first metal layer is deposited and the narrow trenches are filled with same in a step C.

The first metal layer is removed at the surface up to the silicon layer in a step D, the first metal layer remaining in the narrow trenches and thus creating embedded metal contacts.

The silicon layer is structured using a trenching process in a step H, a fixed portion and a switching element being formed, and contact areas of the embedded metal contacts being exposed with respect to the silicon layer.

Figure 6A:
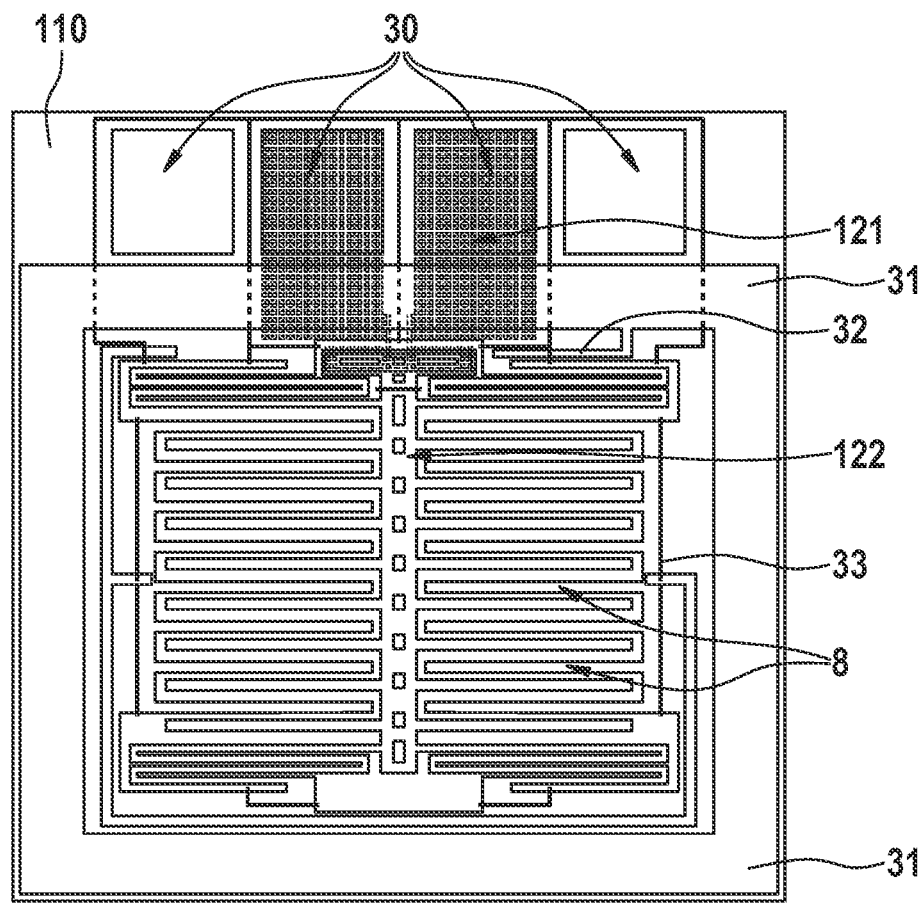
FIGS. 6A and 6B show in a first exemplary embodiment of the present invention a MEMS switch according to the present invention including embedded metal contacts in the unswitched state.
Figure 6B:
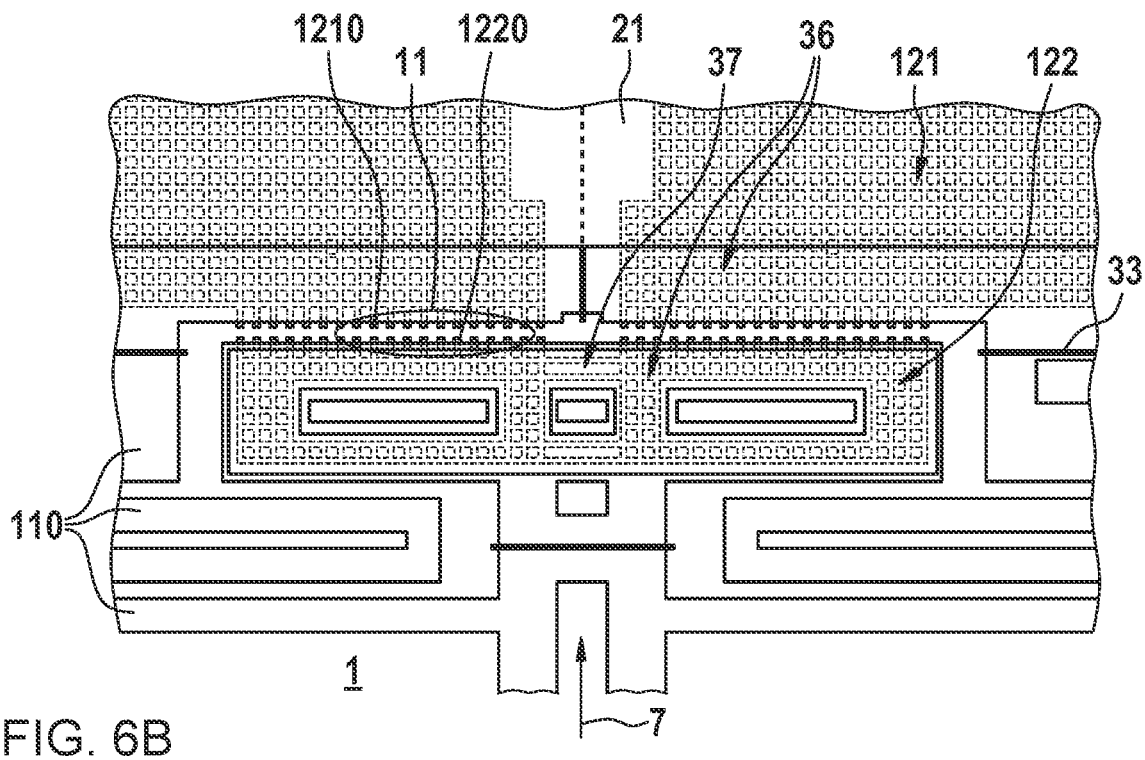

FIGS. 6A and 6B show in a first exemplary embodiment a MEMS switch according to the present invention including embedded metal contacts in the unswitched state. FIG. 6A, in a semitransparent top view, shows a relay according to the present invention together with a capacitive drive and a bonding frame in the basic state. A detail around a switchable contact is shown in enlarged scale in FIG. 6B.

The device includes a silicon layer 110 above a substrate 1 and an insulating layer (not visible in the top view). A fixed portion 121 and a movable switching portion 122 are formed in the silicon layer. A structured first metal layer is embedded in the silicon layer from above. The first metal layer is exposed in areas with respect to the adjoining silicon layer, and together with a first contact area 1210 and an oppositely situated second contact area 1220 forms a switchable electrical contact 11 between fixed portion 121 and switching portion 122. A second structured metal layer 21 is arranged thereabove. The second metal layer forms bond pads 30, the first component of an electrically insulated bonding frame 31, and forms strip conductors 32 that are electrically insulated from silicon layer 110 and that also traverse filled insulation trenches 33.

Silicon layer 110 is divided into individual mutually insulated areas with the aid of filled insulation trenches 33, for example to form stationary counter electrodes 8, and in the switching state to apply a potential to them that is electrically different from the movable mass. Fixed electrodes 8 together with movable electrodes of the switching element form a capacitive drive as described with reference to FIGS. 2 and 3, and are used to move switching element 122 in first direction 7. The embedded first metal layer is also structured to form strip conductors 36 which locally increase the conductivity. The conductivity may be increased even further by the second metal layer in partial areas 37 in which second metal layer 21 fulfills no other function (cf. also FIG. 8 in each case).

Figure 7A:
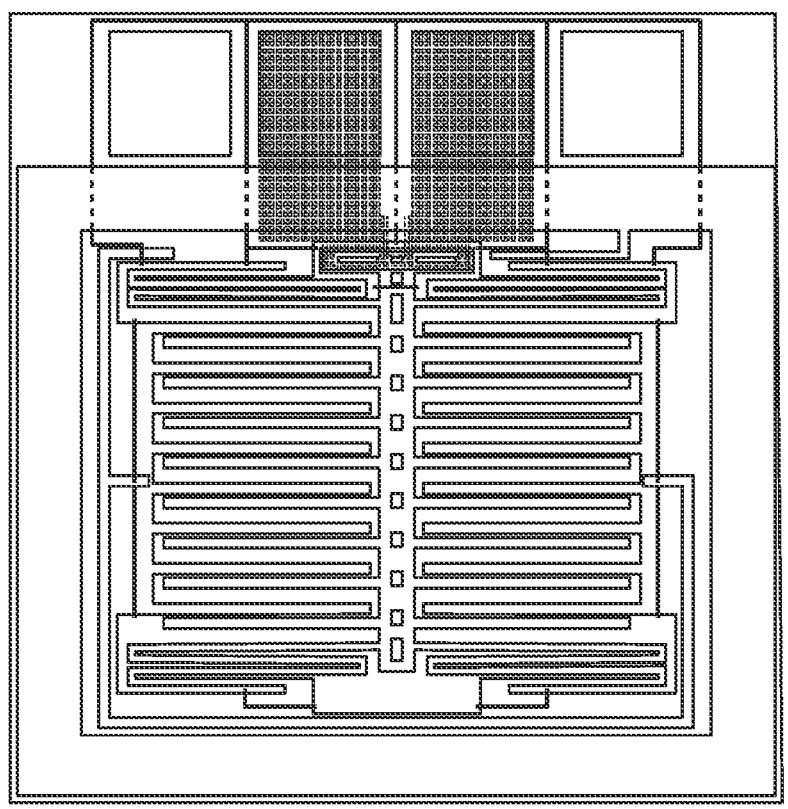
FIGS. 7A and 7B show the MEMS switch according to the present invention including embedded metal contacts from FIGS. 6A and 6B in the switched state.
Figure 7B:
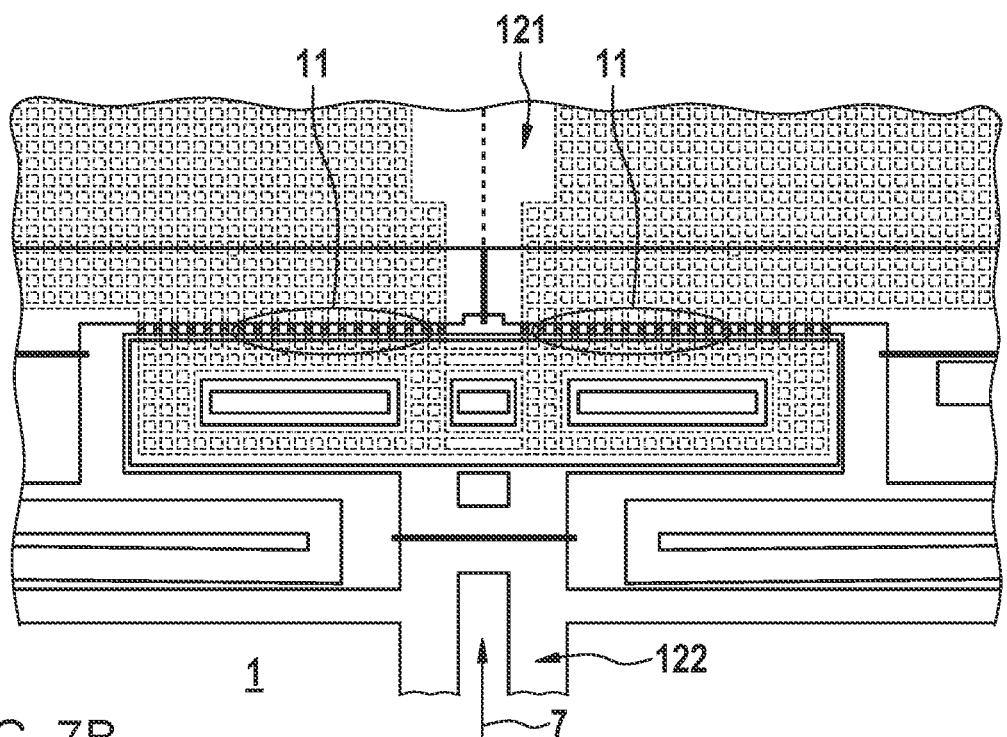

FIGS. 7A and 7B show the MEMS switch according to the present invention including embedded metal contacts from FIGS. 6A and 6B in the switched state. Switching portion 122 is deflected in first direction 7 and rests against fixed portion 121, the first and second contact areas of the embedded metal contacts resting against one another. Electrical contact 11 is thus closed.

Figure 8:
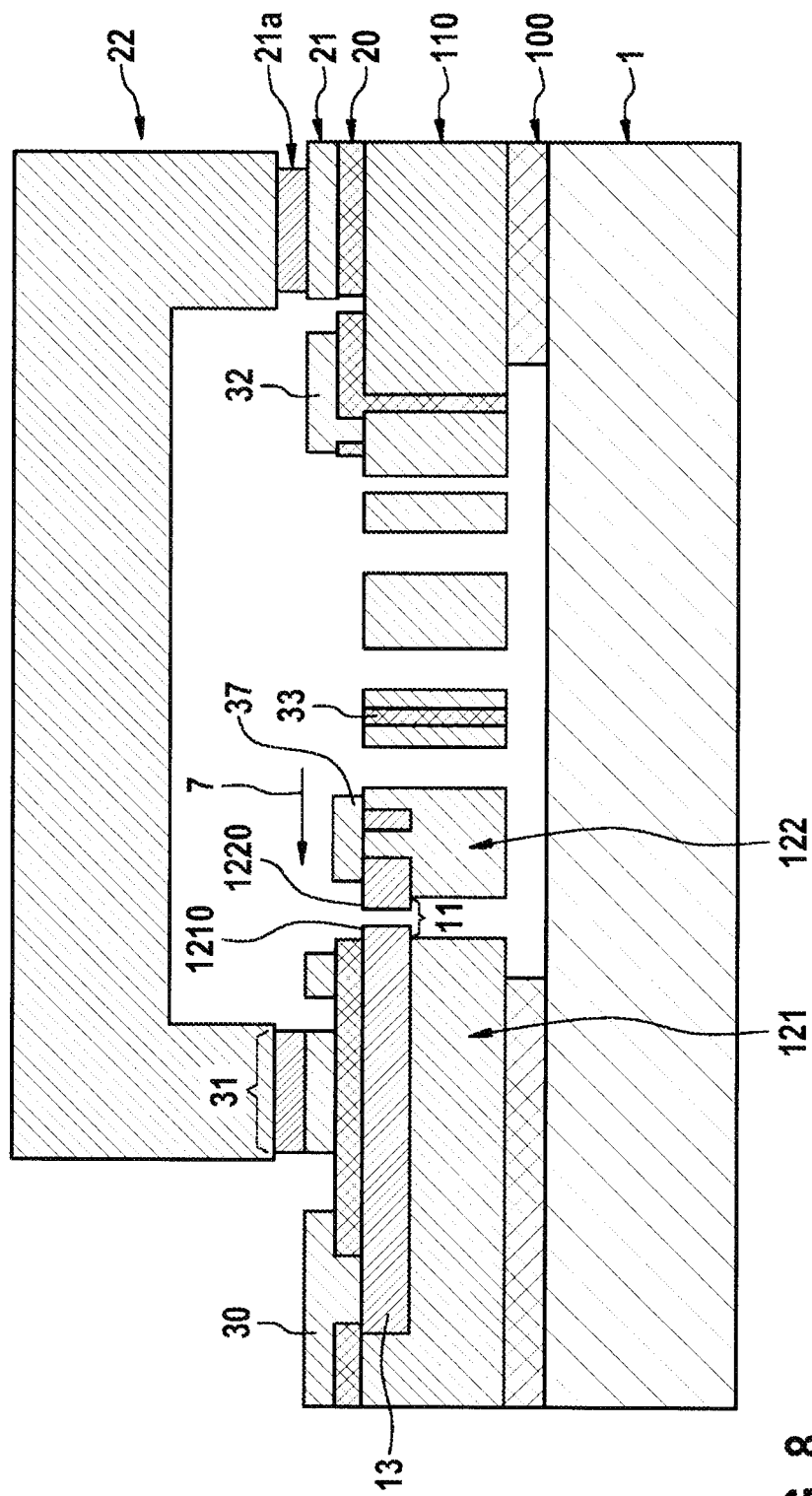
FIG. 8 shows in a second exemplary embodiment of the present invention a MEMS switch according to the present invention including embedded metal contacts and a cap in a sectional illustration.

FIG. 8 shows in a second exemplary embodiment a MEMS switch according to the present invention including embedded metal contacts and a cap, in a sectional illustration. The illustration shows a capacitively actuatable MEMS switch that includes a substrate 1 with a first insulating layer 100 and a silicon layer 110 thereabove, a fixed portion 121 and a movable switching portion 122 being formed in the silicon layer. A first metal layer 13 made of tungsten is situated in recesses in the silicon layer at a side of the silicon layer, the top side, facing away from the substrate, and is thus embedded. The first metal layer is exposed in areas with respect to the adjoining silicon layer, and together with a first contact area 1210 and an oppositely situated second contact area 1220 forms a switchable electrical contact 11 between fixed portion 121 and switching portion 122. A structured dielectric layer 20 is arranged on silicon layer 110 and in insulation trenches 19. Mechanically connected areas of the silicon layer are thus electrically insulated. A structured second metal layer 21 made of aluminum is arranged on dielectric layer 20. The second metal layer forms bond pads 30, the first component of an electrically insulated bonding frame 31, and forms strip conductors 32 that are electrically insulated from silicon layer 110 and that also traverse insulation trenches 19. A third metal layer 21a made of germanium is arranged on second metal layer 21 in the area of the bonding frame, and together with the second metal layer made of aluminum forms a eutectic bond via which a cap 22 is fastened above the micromechanical structures.

LIST OF REFERENCE NUMERALS 1 substrate
2 first electrode
3 first contact surface
4 lever structure
6 suspension springs
7 first direction
8 fixed electrode
9 second insulating layer
10 metal layer
11 contact
12 narrow trenches
13 first metal layer
15 overhang
19 continuous trenches
20 dielectric layer
21 second metal layer
21a third metal layer
22 cap
30 bond pad
31 insulated bonding frame
32 metal layer
33 filled insulation trenches
36 strip conductor
37 partial area
100 first insulating layer
110 silicon layer
120 micromechanical functional layer
121 fixed portion
122 deflectable switching element
1210 first contact area
1220 second contact area

What is claimed is:

1. A method for manufacturing a MEMS switch that includes at least one embedded metal contact, including the following steps:
   A) providing a substrate, wherein a silicon layer is situated on the substrate;
   B) introducing narrow trenches into the silicon layer using anisotropic etching;
   C) filling the narrow trenches by deposition of a first metal layer;
   D) removing the first metal layer at a surface of the silicon layer, the first metal layer remaining in the narrow trenches and thus creating at least one embedded metal contact;
   H) structuring the silicon layer via a trenching process, a fixed portion and a switching element being formed, and a contact area of the at least one embedded metal contact being exposed with respect to the silicon layer,
   wherein the contact area includes a first contact area and an oppositely situated second contact area, wherein the first contact area and the second contact area are exposed with respect to the silicon layer,
   wherein the first metal layer is situated at a side of the silicon layer facing away from the substrate.

2. The method in claim 1, wherein prior to depositing the first metal layer, a thin adhesive layer or a nucleation layer which does not fill the narrow trenches is deposited.

3. The method in claim 2, wherein the thin adhesive layer or nucleation layer is deposited via a silicon reducing reaction that partially removes the silicon layer at a surface thus coated.

4. The method in claim 3, wherein WF6 is utilized as a component of the reducing reaction.

5. The method in claim 2, wherein the structuring in step H is carried out in such a way that the at least one embedded metal contact protrudes beyond an edge of the silicon layer.

6. The method in claim 1, wherein the first metal layer is made of nickel or a nickel-containing material.

7. The method in claim 1, wherein the remaining portion of the first metal layer protrudes laterally from the silicon layer with an overhang at least in the contact area.

8. A method for manufacturing a MEMS switch that includes at least one embedded metal contact, including the following steps:
   A) providing a substrate that includes a silicon layer;
   B) introducing narrow trenches into the silicon layer using anisotropic etching;
   C) filling the narrow trenches by deposition of a first metal layer;
   D) removing the first metal layer at a surface of the silicon layer, the first metal layer remaining in the narrow trenches and thus creating at least one embedded metal contact;
   H) structuring the silicon layer via a trenching process, a fixed portion and a switching element being formed, and a contact area of the at least one embedded metal contact being exposed with respect to the silicon layer,
   wherein the contact area includes a first contact area and an oppositely situated second contact area, wherein the first contact area and the second contact area are exposed with respect to the silicon layer,
   wherein a substrate including a first insulating layer and the silicon layer is provided in step A, and after step H, the first insulating layer is etched below a structured area of the silicon layer in a step I, the switching element being exposed and made movable.

9. A method for manufacturing a MEMS switch that includes at least one embedded metal contact, including the following steps:
   A) providing a substrate that includes a silicon layer;
   B) introducing narrow trenches into the silicon layer using anisotropic etching;
   C) filling the narrow trenches by deposition of a first metal layer;

D) removing the first metal layer at a surface of the silicon layer, the first metal layer remaining in the narrow trenches and thus creating at least one embedded metal contact;

H) structuring the silicon layer via a trenching process, a fixed portion and a switching element being formed, and a contact area of the at least one embedded metal contact being exposed with respect to the silicon layer, wherein the contact area includes a first contact area and an oppositely situated second contact area, wherein the first contact area and the second contact area are exposed with respect to the silicon layer, wherein after step D, narrow, continuous trenches extending to a first insulating layer are etched into the silicon layer in a step E, and a dielectric material is subsequently deposited and structured on the silicon layer in a step F, the continuous trenches being filled with the dielectric material.

10. The method in claim 9, wherein further layer sequences of dielectric and/or metallic layers are applied and structured after step F and prior to step H, and a second metal layer is applied and structured in a step G.

11. A method for manufacturing a MEMS switch that includes at least one embedded metal contact, including the following steps:

A) providing a substrate, wherein a silicon layer is situated on the substrate;

B) introducing narrow trenches into the silicon layer using anisotropic etching;

C) filling the narrow trenches by deposition of a first metal layer;

D) removing the first metal layer at a surface of the silicon layer, the first metal layer remaining in the narrow trenches and thus creating at least one embedded metal contact;

H) structuring the silicon layer via a trenching process, a fixed portion and a movable switching element being formed, and a contact area of the at least one embedded metal contact being exposed with respect to the silicon layer, wherein the contact area includes a first contact area and an oppositely situated second contact area, wherein the first contact area and the second contact area are exposed with respect to the silicon layer, and wherein the first metal layer is situated at a side of the silicon layer facing away from the substrate and forms at least one switchable electrical contact between the fixed portion and the switching element.

12. A method for manufacturing a MEMS switch that includes at least one embedded metal contact, including the following steps:

A) providing a substrate that includes a silicon layer;

B) introducing narrow trenches into the silicon layer using anisotropic etching;

C) filling the narrow trenches by deposition of a first metal layer;

D) removing the first metal layer at a surface of the silicon layer, the first metal layer remaining in the narrow trenches and thus creating at least one embedded metal contact;

H) structuring the silicon layer via a trenching process, a fixed portion and a switching element being formed, and a contact area of the at least one embedded metal contact being exposed with respect to the silicon layer, wherein the contact area includes a first contact area and an oppositely situated second contact area, wherein the first contact area and the second contact area are exposed with respect to the silicon layer, wherein the first metal layer is made of tungsten.

* * * * *